United States Patent
Barberi

(10) Patent No.: US 7,119,541 B2
(45) Date of Patent: Oct. 10, 2006

(54) MULTIPLY-TUNED VOLUME RESONATOR FOR MAGNETIC RESONANCE IMAGING AND SPECTROSCOPY

(75) Inventor: Enzo Barberi, London (CA)

(73) Assignee: XLR Imaging Inc., London (CA)

( * ) Notice: Subject to any disclaimer, the term of this patent is extended or adjusted under 35 U.S.C. 154(b) by 0 days.

(21) Appl. No.: 11/070,921

(22) Filed: Mar. 3, 2005

(65) Prior Publication Data

US 2006/0012370 A1  Jan. 19, 2006

Related U.S. Application Data

(60) Provisional application No. 60/549,171, filed on Mar. 3, 2004.

(51) Int. Cl.
*G01V 3/00* (2006.01)
(52) U.S. Cl. .................. 324/318; 324/322; 600/422
(58) Field of Classification Search ............. 324/318, 324/322; 600/422
See application file for complete search history.

(56) References Cited

U.S. PATENT DOCUMENTS

| | | | |
|---|---|---|---|
| 4,916,418 A | 4/1990 | Rath | 333/219 |
| 5,041,790 A | 8/1991 | Tropp et al. | 324/318 |
| 5,144,240 A | 9/1992 | Mehdizadeh et al. | 324/318 |
| 5,194,811 A | 3/1993 | Murphy-Boesch et al. | 324/322 |
| 5,202,635 A | 4/1993 | Srinivasan et al. | 324/322 |
| 5,365,173 A * | 11/1994 | Zou et al. | 324/318 |
| 5,680,047 A | 10/1997 | Srinivasan et al. | 324/318 |
| 6,100,694 A | 8/2000 | Wong | 324/318 |
| 6,236,206 B1 | 5/2001 | Hartman et al. | 324/318 |

* cited by examiner

*Primary Examiner*—Lóuis M. Arana
(74) *Attorney, Agent, or Firm*—Baker & Daniels

(57) ABSTRACT

A multiply-tuned volume resonator comprises a generally cylindrical birdcage comprising a pair of end rings and generally parallel column elements bridging the end rings at generally equal circumferentially spaced locations. The column elements carry at least two distinct-valued, alternating impedance components. A plurality of capacitors is disposed on the end rings. Each capacitor is positioned between a pair of adjacent column elements. The capacitors on the end rings are tuned to the resonant frequency associated with a low frequency paramagnetic nuclei and the impedance components on the column elements are tuned to the resonant frequency associated with at least one high frequency paramagnetic nuclei. Direct drives are provided for high frequency and low frequency sections of the volume resonator.

20 Claims, 8 Drawing Sheets

MULTIPLY-TUNED VOLUME RESONATOR FOR MAGNETIC RESONANCE IMAGING AND SPECTROSCOPY

CROSS-REFERENCE TO RELATED APPLICATION

This application claims the benefit of U.S. Provisional Patent Application No. 60/549,171 filed on Mar. 3, 2004 for an invention entitled "Multiply-Tuned Volume Resonator for Magnetic Resonance Imaging and Spectroscopy".

FIELD OF THE INVENTION

The present invention relates generally to magnetic resonance (MR) imaging and more specifically, to a multiply-tuned volume resonator for magnetic resonance imaging and spectroscopy.

BACKGROUND OF THE INVENTION

Nuclear Magnetic Resonance (NMR) Imaging, or Magnetic Resonance Imaging (MRI) as it is commonly known, is a non-invasive imaging modality that can produce high resolution, high contrast images of the interior of the human body. MRI involves the interrogation of the nuclear magnetic moments of a subject placed in a strong magnetic field with radio frequency (RF) magnetic fields. An MRI system typically comprises a fixed magnet to create the main strong magnetic field, a gradient coil assembly to permit spatial encoding of signal information, a variety of RF resonators or RF coils as they are commonly known, to transmit RF energy to, and receive signals emanating back from, the subject being imaged, and a computer to control overall MRI system operation and create images from the signal information obtained.

The large majority of RF coils used in MR imaging are tuned to $^1$H due to the high abundance of this paramagnetic nucleus in the body, and the resulting ability to produce detailed structural images of body and tissue structure. However, several alternate paramagnetic nuclei are desirable for MR imaging and spectroscopy applications such as for example $^{13}$C, $^{31}$P, $^{23}$Na, etc. . . . . Each of these applications however, requires a special RF coil tuned specifically to the particular resonant frequency of the selected paramagnetic nucleus.

In many MR imaging and spectroscopy applications it is desirable to simultaneously or sequentially probe multiple paramagnetic nuclei. Using multiple single tuned RF coils for the various paramagnetic nuclei is inconvenient, requires time consuming RF coil changes, and patient repositioning, which can result in registration errors. In addition, investigations utilizing the Nuclear Overhauser Effect (NOE) or Proton Decoupling are not possible with single tuned RF coils. To deal with these problems, RF coils capable of multiple tuning for MR imaging applications have been considered.

For example, U.S. Pat. No. 6,236,206 to Hartman discloses a birdcage coil capable of multiple tunings for different paramagnetic nuclei. Unfortunately the birdcage coil can be tuned only to one resonant frequency at any one time limiting the birdcage coil to single tuned imaging applications.

U.S. Pat. No. 4,916,418 to Rath discloses a double tuned birdcage coil in which discrete inductors are placed across the leg capacitors to introduce a second set of resonances. Unfortunately, the birdcage coil is not of an interleaved coil design and is not particularly suited to very high-field (3 Tesla (T) or greater), large volume imaging applications.

U.S. Pat. No. 5,202,635 to Srinivassan discloses a dual tuned RF coil based on a four (4) ring low-pass birdcage coil. Similar to the Rath birdcage coil, this birdcage coil is not an interleaved structure and therefore, results in different sensitive volumes for the H$^+$ and the alternate 'X-nuclei' modes, which can lead to registration errors. Also as the birdcage coil is based on a low-pass design, it suffers significant electric field losses making it unsuitable for very high-field (3 T or greater) imaging applications.

U.S. Pat. No. 5,680,047 to Srinivassan discloses a dual tuned coil based on a solenoid coil geometry. As the coil does not conform to a minimum inductance design, it suffers electric field losses making it unsuitable for very high-field imaging applications.

U.S. Pat. No. 5,144,240 to Mehdizadeh discloses a dual tuned birdcage coil in which discrete inductors are added across the leg capacitors to introduce a second set of resonances. Similar to the Rath birdcage coil, this birdcage coil is not of an interleaved coil design and is not particularly suited to very high-field imaging applications.

U.S. Pat. No. 6,100,694 to Wong discloses a multiple tuned birdcage coil based on a four (4) ring birdcage design. As the birdcage coil is not an interleaved coil structure, it results in different sensitive volumes for the H$^+$ and X-nuclei modes, which can lead to registration errors. Also as the birdcage coil is based on a low-pass design, it suffers significant electric field losses making it unsuitable for very high-field imaging applications.

U.S. Pat. No. 5,041,790 to Tropp discloses a dual tuned RF coil in which separate coils are used and tuned to different paramagnetic nuclei of interest. The RF coil uses a birdcage coil for H$^+$ imaging and Helmholtz coils for alternate paramagnetic nuclei.

U.S. Pat. No. 5,194,811 to Murphy-Boesch discloses a dual tuned RF coil design based on a four (4) ring low-pass birdcage coil. Similar to a number of the above-described designs, this birdcage coil is not an interleaved structure and therefore, results in different sensitive volumes for the H$^+$ and X-nuclei modes, which can lead to registration errors. Also as it is based on a low-pass design, the birdcage coil suffers significant electric field losses making it unsuitable for very high-field imaging applications.

The publication entitled "A Multiply-Tuned Hybrid Birdcage Volume Resonator for Transmit/Receive and Transmit-Only High Field NMR Imaging, Spectroscopy, and Multi-Nuclear Phased Array Applications" authored by Barberi. et al. and published in the proceedings of the International Society of Magnetic Resonance Medicine in 2002 discloses a dual tuned resonator comprising a sixteen (16) element cylindrical hybrid birdcage resonator. Reactive tuning elements are placed on the resonator end rings and column elements. Tuning the resonant structure to two (2) distinct, homogeneous modes is achieved using a combination of single-valued end ring capacitances and an arrangement of distinct-valued, alternating, interleaved impedance elements on the columns. The discrete column impedance elements may be capacitive, zero impedance or inductive. Alternating capacitive elements on the columns effectively yields two interleaved hybrid resonators. Alternating capacitive and zero impedance elements effectively yields a high gamma hybrid birdcage resonator interleaved with a low gamma high pass birdcage resonator. The two distinct homogeneous modes of the resonant structure are isolated from each other. Isolation is provided through the placement of discrete element series/parallel resonant pass-reject electronic blocking networks on the low gamma and high gamma sections of the volume resonator.

The electronic blocking networks associated with the high gamma section are passive electronic high gamma pass/low gamma reject networks while the electronic blocking networks associated with the low gamma section are passive electronic high gamma reject/low gamma pass networks. Each of these networks comprises three discrete reactive components. The networks are used to maintain the original resonant frequency of either the low gamma section or high gamma section when either is tuned in the absence of other gamma tuning components. This attempts to ensure coupling isolation between the high gamma section and the low gamma section of the volume resonator.

Unfortunately, this volume resonator suffers disadvantages in all of the electronic blocking networks for isolating the low gamma and high gamma sections of the volume resonator must be precisely aligned in order to avoid sensitivity degradation. As will be appreciated, aligning the blocking networks is an extremely difficult task. Also, as the volume resonator makes use of an inductive drive to preserve symmetry of the volume resonator, the volume resonator requires additional adjustments to achieve desired coupling and preserve resonator homogeneity. This is due to the fact that the inductive drive loops produce their own magnetic fields that perturb resonator homogeneity. Furthermore, the volume resonator requires a shield to reduce radiative losses at the high gamma frequency.

As will be appreciated, there exists a need for a volume resonator capable of simultaneous or sequential probing of multiple paramagnetic nuclei ('multiply-tuned', e.g. $^1H$ for structural information and $^{13}C$ or $^{31}P$ for spectroscopy data) where each paramagnetic nuclei has the same sampling volume within the subject being imaged. There also exists a need for a multiply-tuned volume resonator which is particularly suited to high-field MR imaging systems and which can be unshielded for non-claustrophobic clinical applications.

It is therefore an object of the present invention to provide a novel multiply-tuned volume resonator for magnetic resonance imaging and spectroscopy.

SUMMARY OF THE INVENTION

Accordingly, in one aspect of the present invention there is provided a multiply-tuned volume resonator comprising:
   a pair of end rings;
   a plurality of column elements bridging said end rings, said column elements being spaced with a generally even periodicity, said column elements comprising at least two distinct-valued, alternating impedance elements;
   a plurality of reactive elements disposed about said end rings, wherein the reactive elements about said end rings are tuned to the resonant frequency associated with one type of paramagnetic nuclei and wherein the impedance elements are tuned to the resonant frequency associated with at least one other type of paramagnetic nuclei; and
   direct drives for high frequency and low frequency sections of said volume resonator.

In one embodiment, the one type and other type of paramagnetic nuclei are low frequency and high frequency paramagnetic nuclei respectively. The direct drives comprise low-pass impedance matching networks associated with the reactive elements to match the low frequency impedance of the volume resonator to the impedance of the low frequency paramagnetic nuclei and high-pass impedance matching networks associated with the column elements to match the high frequency impedance of the volume resonator to the impedance of the high frequency paramagnetic nuclei.

In one embodiment, the direct drives associated with the high frequency section of the volume resonator are coupled to column elements allowing the volume resonator structure to take on a split-ring design. In an alternative embodiment, the direct drives associated with both the high and low frequency sections of the volume resonator are coupled to an end ring to improve resonator homogeneity.

Depending on the difference in the resonant frequencies of the low frequency and high frequency paramagnetic nuclei, the column elements may carry alternating capacitive and zero impedance elements, alternating different valued capacitive elements or alternating capacitive and inductive elements.

According to another aspect of the present invention there is provided a multiply-tuned volume resonator comprising:
   a generally cylindrical birdcage comprising a pair of end rings and generally parallel column elements bridging said end rings at generally equal circumferentially spaced locations, said column elements carrying at least two distinct-valued, alternating impedance components;
   a plurality of capacitors disposed on said end rings, each capacitor being positioned between a pair of adjacent column elements, wherein the capacitors on said end rings are tuned to the resonant frequency associated with a low frequency paramagnetic nuclei and wherein the impedance components on the column elements are tuned to the resonant frequency associated with at least one high frequency paramagnetic nuclei; and
   direct drives for high frequency and low frequency sections of said volume resonator.

The multiply-tuned volume resonator provides advantages in that multiple paramagnetic nuclei can be simultaneously or sequentially probed for use in a variety of MR imaging and spectroscopy applications. Also, as the multiply-tuned volume resonator is of an interleaved hybrid birdcage design, identical sampling volumes for each paramagnetic nuclei are provided thereby limiting registration errors. The use of the hybrid birdcage design also results in low electric field losses making the multiply-tuned volume resonator particularly suited to very high-field i.e. 3 Telsa (T) or greater, imaging applications.

In addition, as the multiply-tuned volume resonator can take an unshielded configuration, it permits an open, mainly unobstructed view thus providing a less claustrophobic environment for the subject being imaged with no loss in signal-to-noise ratio (SNR) or field homogeneity.

BRIEF DESCRIPTION OF THE DRAWINGS

Embodiments will now be described more fully with reference to the accompanying drawings in which.

DETAILED DESCRIPTION OF PREFERRED EMBODIMENTS

Figure 1:
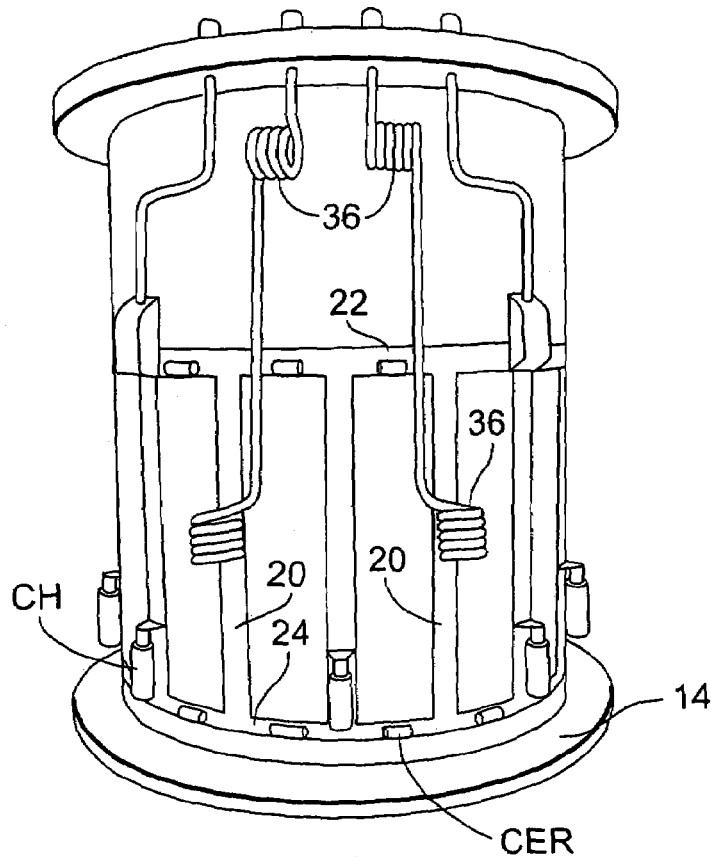
FIG. 1 is an isometric view of an unshielded, high-field, dual-tuned volume resonator for magnetic resonance imaging and spectroscopy.
Figure 2:
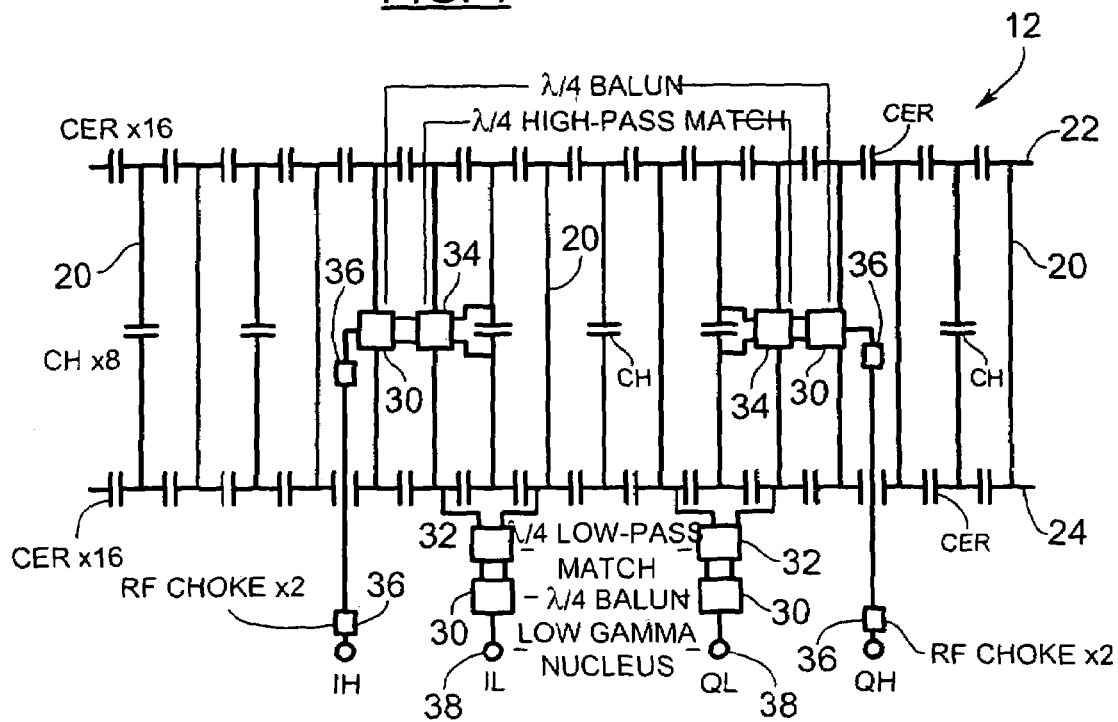
FIG. 2 is a schematic diagram of the volume resonator of FIG. 1.

Turning now to FIGS. 1 and 2, a multiply-tuned volume resonator is shown and is generally identified by reference numeral 10. In this particular embodiment, the volume resonator is of a hybrid, unshielded cylindrical birdcage design and is dual-tuned. Specifically, the volume resonator 10 is tuned for $^1$H high frequency paramagnetic nuclei and for $^{31}$P low frequency paramagnetic nuclei. The volume resonator 10 comprises a birdcage 12 mounted on a spool-shaped support 14 formed of electrically non-conductive material such as for example plastic.

Birdcage 12 is generally cylindrical and comprises an even number of generally equally spaced, generally parallel column elements 20 joined at their ends to upper and lower end rings 22 and 24 respectively. The total number of column elements 20 in the volume resonator 10 is divisible by four (4) i.e. 12, 16, 24, 32 etc.

Reactive tuning elements in the form of single-valued capacitors CER are provided along the end rings 22 and 24 between adjacent column elements 20. The column elements 20 carry an arrangement of two distinct-valued, alternating, interleaved impedance elements. Specifically, selected column elements carry leg capacitors CH while other column elements 20 include no discrete components. These column elements are continuous conductors and have zero impedance. Thus in the embodiment shown, the birdcage 12 includes alternating reactive column elements (i.e. those carrying leg capacitors CH) and zero impedance column elements 20 (i.e. those free of impedance elements). The combination of single-valued capacitors CER on the end rings 22, 24 and the two distinct-valued, alternating, interleaved impedance elements on the column elements 20 allows the resonant structure of the birdcage 12 to be tuned to two (2) distinct homogenous modes.

The combination of capacitive and zero impedance elements on the column elements 20 effectively yields a hybrid birdcage resonator interleaved with a high-pass birdcage resonator. The interleaved hybrid resonant frequencies are primarily determined by the capacitors CER and the leg capacitors CH. The interleaved high-pass resonant frequency is determined primarily by the capacitors CER and the distributed inductance of the zero impedance column elements 20. Radiative losses at the higher gamma frequency of operation are effectively reduced by the leg capacitors CH, which are tuned to the higher gamma frequency.

In addition to the column elements 20 and end rings 22, 24, birdcage 12 further includes direct drives for the high frequency and low frequency sections of the volume resonator incorporating λ/4 baluns 30, λ/4 low-pass impedance matching networks 32 and λ/4 high-pass impedance matching networks 34. The λ/4 baluns 30 are used to electrically isolate the volume resonator 10 from the MRI system shield ground and are used for all paramagnetic nuclei. The λ/4 low-pass impedance matching networks 32 are used on the interface between the λ/4 baluns 30 and the low frequency tuned section of the volume resonator 10. This matches the impedance of the low frequency paramagnetic nuclei to the characteristic impedance of the volume resonator 10, while providing additional electronic isolation between the low frequency and high frequency sections of the volume resonator. The λ/4 high-pass impedance matching networks 34 are used on the interface between the λ/4 baluns 30 and the high frequency tuned section of the volume resonator 10. This matches the impedance of the high frequency paramagnetic nuclei to the characteristic impedance of the volume resonator 10, while providing additional electronic isolation between the high frequency and low frequency sections of the volume resonator.

Figures 3A, 3B, 3C:
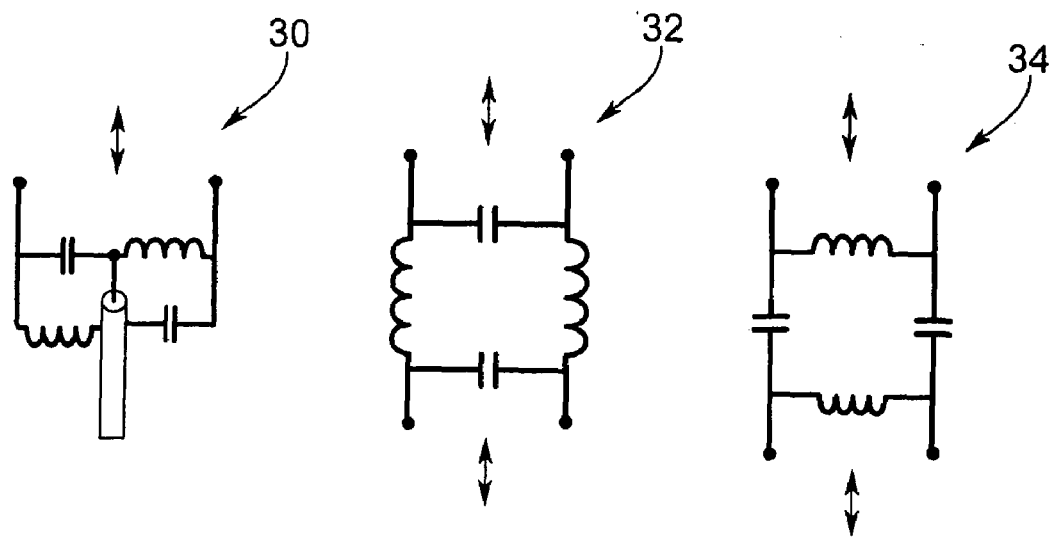
FIG. 3a is a schematic diagram of a λ/4 balanced/unbalanced antenna (balun) forming part of the volume resonator of FIGS. 1 and 2.
FIG. 3b is a schematic diagram of a λ/4 low-pass impedance matching network forming part of the volume resonator of FIGS. 1 and 2.
FIG. 3c is a schematic diagram of a λ/4 high-pass impedance matching network forming part of the volume resonator of FIGS. 1 and 2.

Each direct drive for the low frequency section of the volume resonator includes a λ/4 low-pass impedance matching network 32 straddling a different reactive column element 20 as well as a pair of capacitors CER on the end ring 24. The λ/4 low-pass impedance matching networks 32 are spaced along the end ring 24 such that they are separated by 90 degrees of electrical separation, in this case by three column elements 20. The capacitor and inductor layout of each λ/4 low-pass impedance matching network 32 is shown in FIG. 3b. Each λ/4 low-pass impedance matching network 32 is also coupled to one of the λ/4 baluns 30. The capacitor and inductor layout of each λ/4 balun 30 is shown in FIG. 3a. The λ/4 baluns 30 coupled to the λ/4 low-pass impedance matching networks 32 are also coupled to the low frequency terminals 38 of the volume resonator 10.

Each direct drive for the high frequency section of the volume resonator includes a λ/4 high-pass impedance matching networks 34 straddling the leg capacitors CH of the column elements 20 that are straddled by the λ/4 low-pass impedance matching networks 32. The capacitor and inductor layout of each λ/4 high-pass impedance matching network 34 is shown in FIG. 3c. The λ/4 high-pass impedance matching networks 34 similarly are coupled to λ/4 baluns 30. These λ/4 baluns 30 are coupled to the high frequency terminals 40 of the volume resonator 10 via RF chokes 36. In particular, a pair of RF chokes 36 is interposed between each of these λ/4 baluns 30 and its associated high frequency terminal 40.

The impedance elements carried by the column elements 20 are selected based on the resonant frequencies at which the volume resonator 10 is tuned. The combination of capacitive elements and zero impedance elements is suitable for applications where the resonant frequencies differ by less than a factor of three. As previously mentioned, the volume resonator 10 in this embodiment is tuned for $^{31}$P—$^1$H, 69

MHz–170 MHz at 4 T and thus, the capacitive/zero impedance element combination is appropriate.

Using column elements 20 including different-valued capacitive elements only rather than the capacitive/zero impedance element combination described above, is also suitable for applications where the resonant frequencies differ by less than a factor of three. When only capacitive elements are used, the capacitive arrangement on the column elements effectively yields two interleaved hybrid resonators.

If the resonant frequencies at which the volume resonator is to be tuned differ by more than a factor of three, i.e. $^{13}C$—$^{1}H$, 43 MHz-170 MHz and $^{23}Na$—$^{1}H$, 45 MHz–170 MHz, alternating, interleaved capacitive and inductive column elements are suitable. When capacitive and inductive column elements are used, the capacitive/inductive element arrangement on the column elements effectively yields a hybrid birdcage resonator interleaved with an inductively loaded high-pass birdcage resonator.

To avoid the need to precisely align multiple blocking networks as is required in the previously described Barberi et al. volume resonator, the low gamma section and the high gamma section of the volume resonator are firstly tuned individually. This produces a net shift in the low gamma and high gamma resonant frequencies requiring the low gamma and high gamma sections to be retuned slightly to return them to their resonant frequencies.

The direct drive scheme maintains symmetry of the volume resonator and avoids the problems created by the magnetic fields of inductive drives thereby to improve resonator homogeneity. Also, this scheme allows all of the direct drive connections to be provided on one end ring allowing the birdcage to take a split-ring configuration. This is particularly suited to clinical environments. In addition, as discrete components are used in the high frequency section of the volume resonator 10, electric field radiative losses are significantly reduced as described in the publication entitled "Shielded and Unshielded High-Pass and Hybrid Birdcage Resonators for Use at 3 T and Above: A Comparison" authored by Vamanan et al. and published in the proceedings of the International Society of Magnetic Resonance Medicine, Volume 12, page 1553, May 2004, the content of which is incorporated herein by reference.

Figure 4:
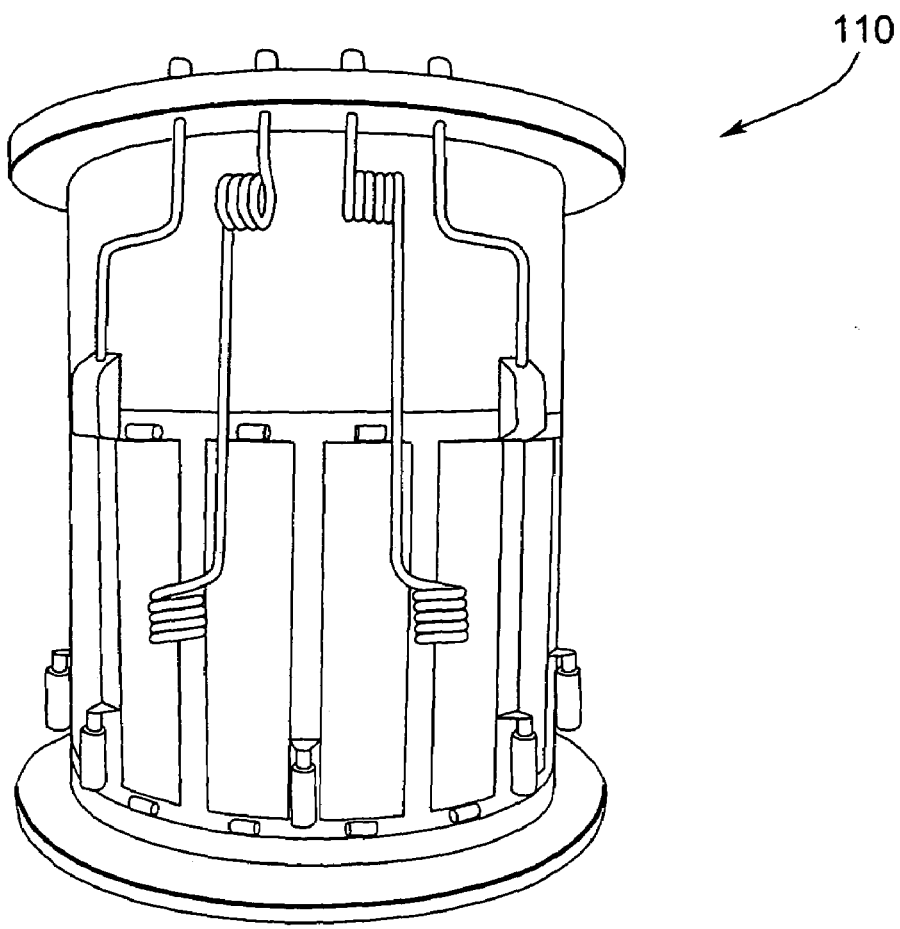
FIG. 4 is an isometric view of a 3 T $^{23}$Na—$^1$H unshielded, high-field, dual-tuned volume resonator.
Figure 5:
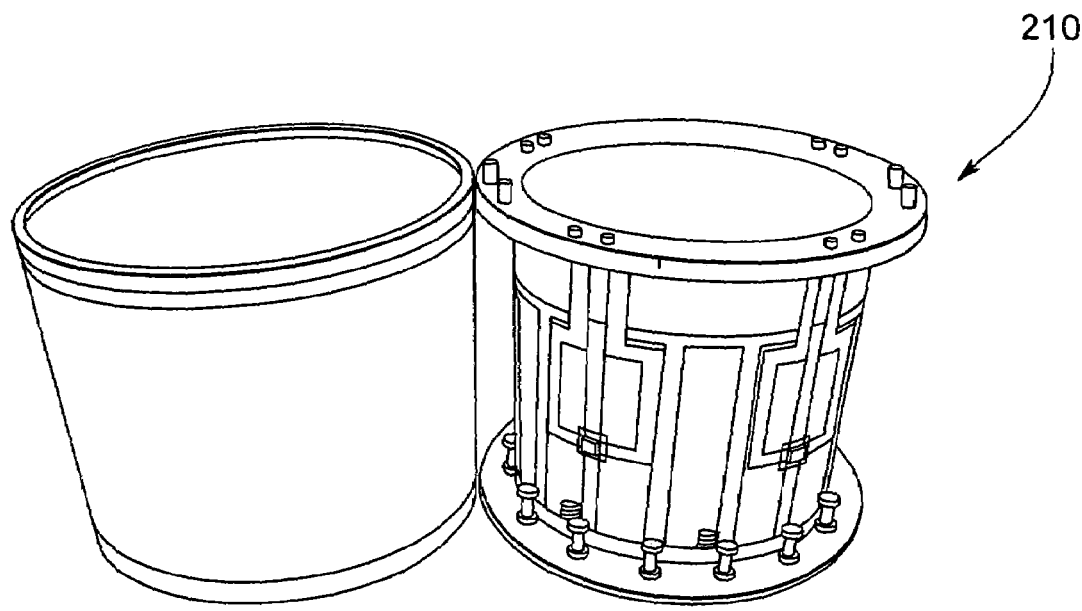
FIG. 5 is an isometric view of a 4 T $^{13}$C—$^1$H shielded, high-field, dual-tuned volume resonator.

FIGS. 4 and 5 are isometric views of alternative volume resonators 110 and 210 respectively. The volume resonator 110 is very similar to that of the previous embodiment but differs from the volume resonator 10 in terms of tuning. Specifically, the volume resonator 110 is tuned for $^{1}H$ high frequency paramagnetic nuclei and $^{23}Na$ low frequency paramagnetic nuclei at 3 T. The volume resonator 210 is of a shielded design tuned for $^{1}H$ high frequency paramagnetic nuclei and $^{13}C$ low frequency paramagnetic nuclei at 4 T.

Figure 6:
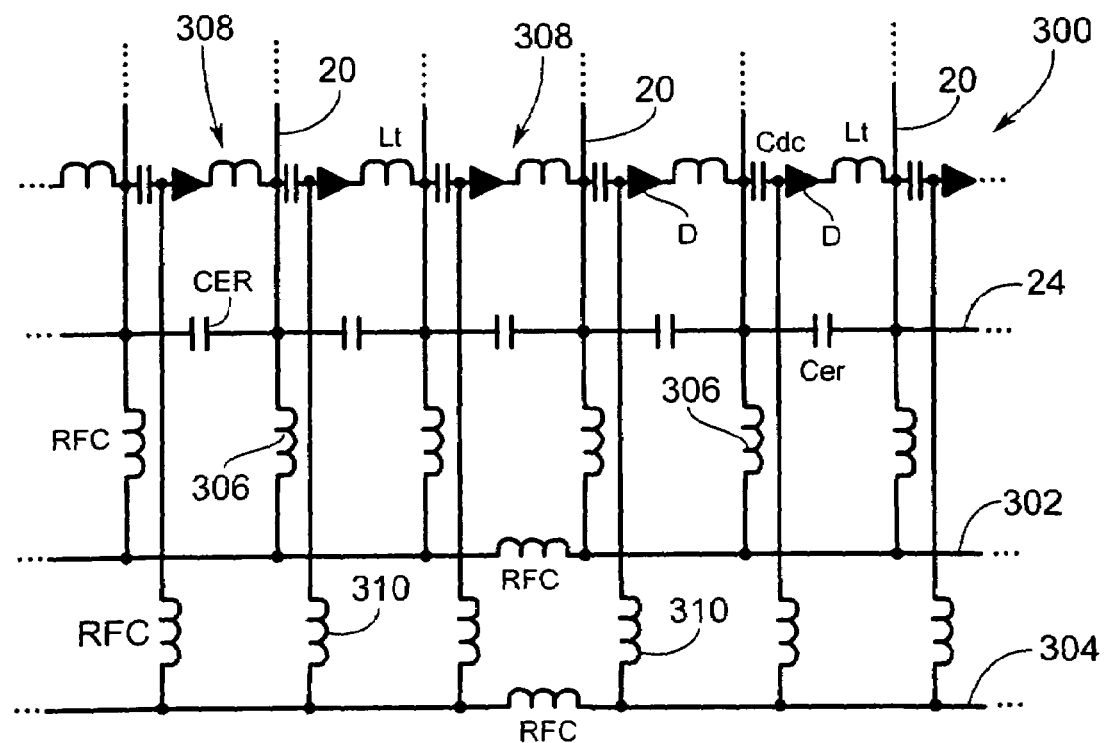
FIG. 6 is a schematic diagram of a transmit-only control circuit for use with the volume resonators of FIGS. 1 to 5.

FIG. 6 shows a transmit-only control circuit 300 for use with the volume resonators of FIGS. 1 to 5 to limit the volume resonators to transmit-only applications. As can be seen, the transmit-only control circuit 300 includes a pair of bias rings 302 and 304 disposed below the end ring 24. Each bias ring 300, 302 includes a single inductor RFC. The bias ring 302 is coupled to the end ring 24 by a series of inductors 306, with each inductor 306 being associated with a respective column element 20. A series circuit 308 including a capacitor Cdc, a PIN diode D and an inductor Lt bridges each column element 20. The bias ring 304 is coupled to the series circuits 308 by inductors 310 which intersect the series circuits 308 between the capacitors Cdc and the PIN diodes D. The bias rings 302 and 304 provide voltage control while the series circuits 308 control end ring detuning reactances. Further specifics of the transmit-only control circuit 300 can be found in the publication entitled "A Transmit-Only/Receive-Only (TORO) RF System for High-Field MRI/MRS Applications" authored by Barberi et al. and published in Magnetic Resonance Medicine, Volume 43 at pages 284–289 (2000), the content of which is incorporated herein by reference.

Figure 7:
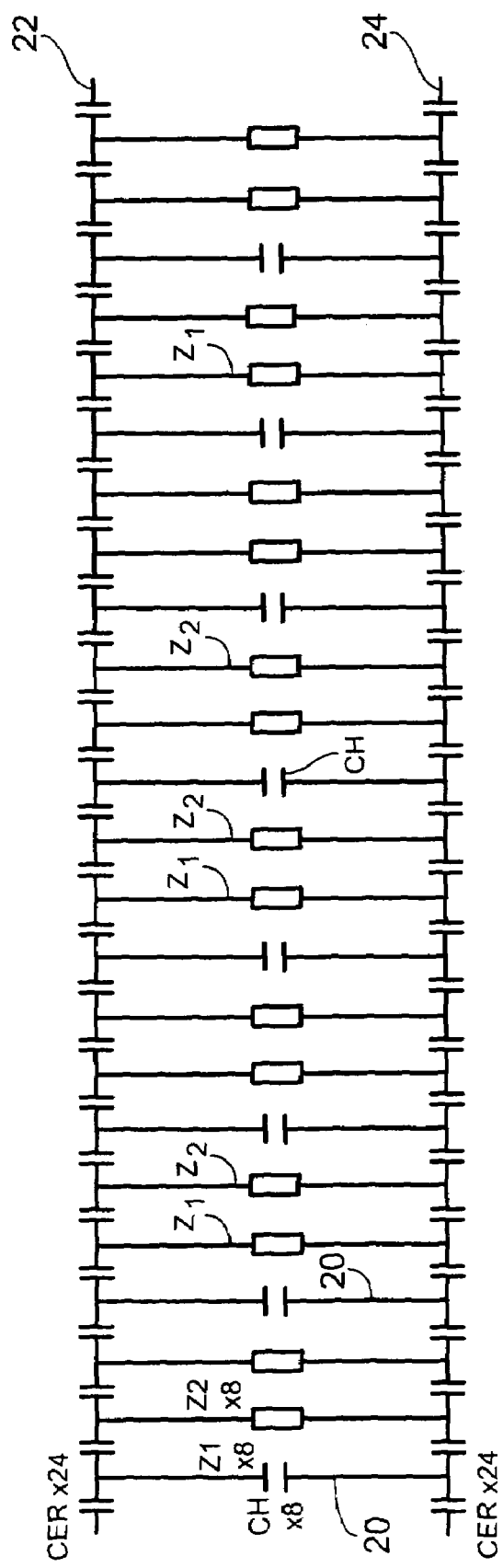
FIG. 7 is a schematic diagram of an unshielded, high-field, triple-tuned volume resonator.

If desired, the volume resonator can be tuned to three or more homogenous resonant frequencies by interleaving other distinct-valued, impedance elements in a periodic fashion about the end rings 22, 24 such as is shown in FIG. 7. In this example, each capacitive column element 20 is separated by two different impedance column elements $Z_1$ and $Z_2$.

Figure 8:
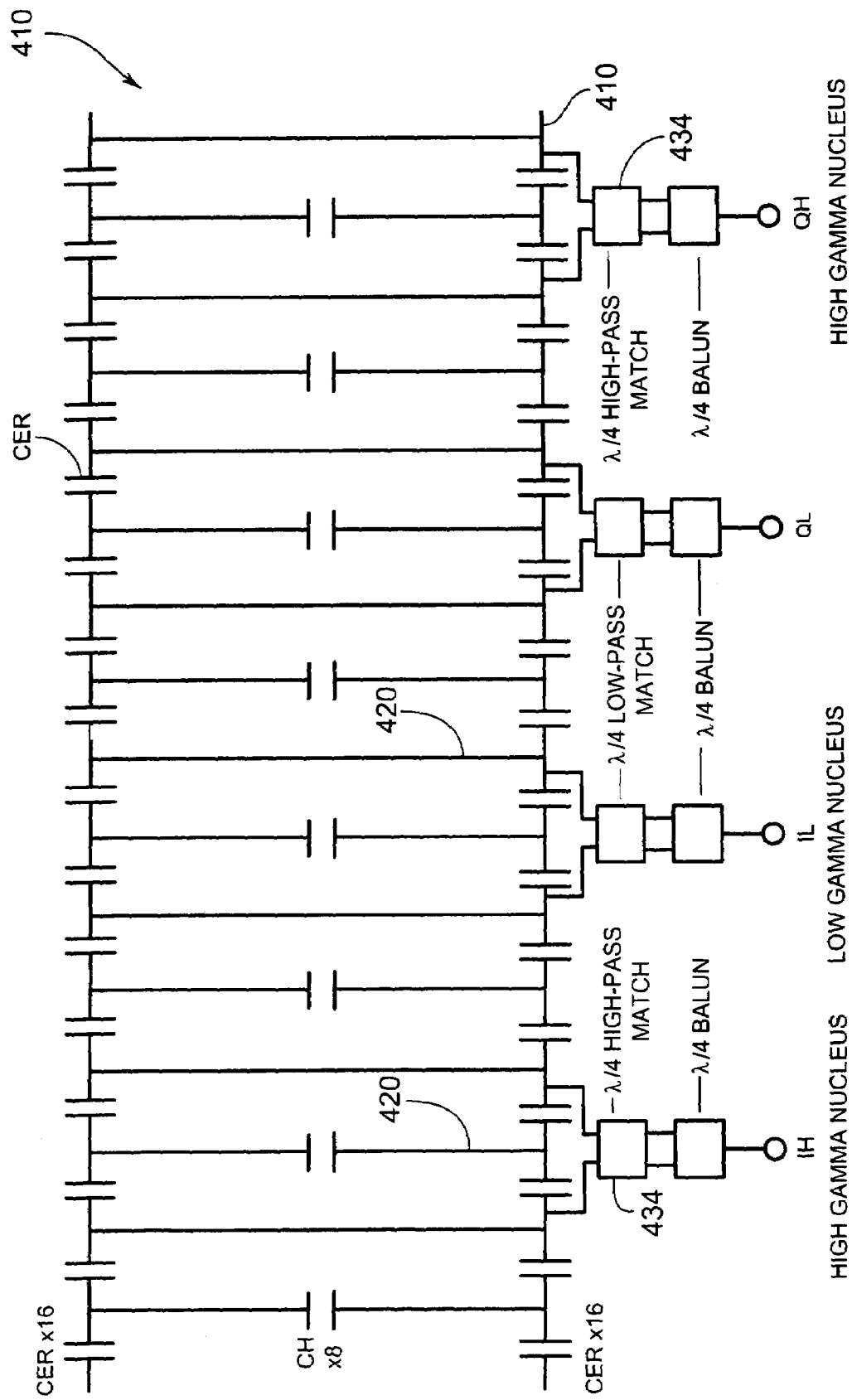
FIG. 8 is a schematic diagram of another embodiment of a volume resonator.

FIG. 8 shows yet another embodiment of a volume resonator 410 designed to improve high gamma homogeneity. In this embodiment, the λ/4 high-pass impedance matching networks 434 are coupled to the end ring 424 rather than to column elements 420. Similar to the λ/4 low-pass impedance matching networks 432, each λ/4 high-pass impedance matching network 434 straddles a different reactive column element 420 as well as a pair of capacitors CER on the end ring 424. The λ/4 high-pass impedance matching networks 434 in this case are separated by 90 degrees of electrical separation. By coupling the direct drives for both the high frequency and low frequency sections of the volume resonator 410 to the end ring 424, hot spots in the column elements are avoided thereby to maintain resonator homogeneity. This design is particularly suited to high end, research environments.

Figure 9:
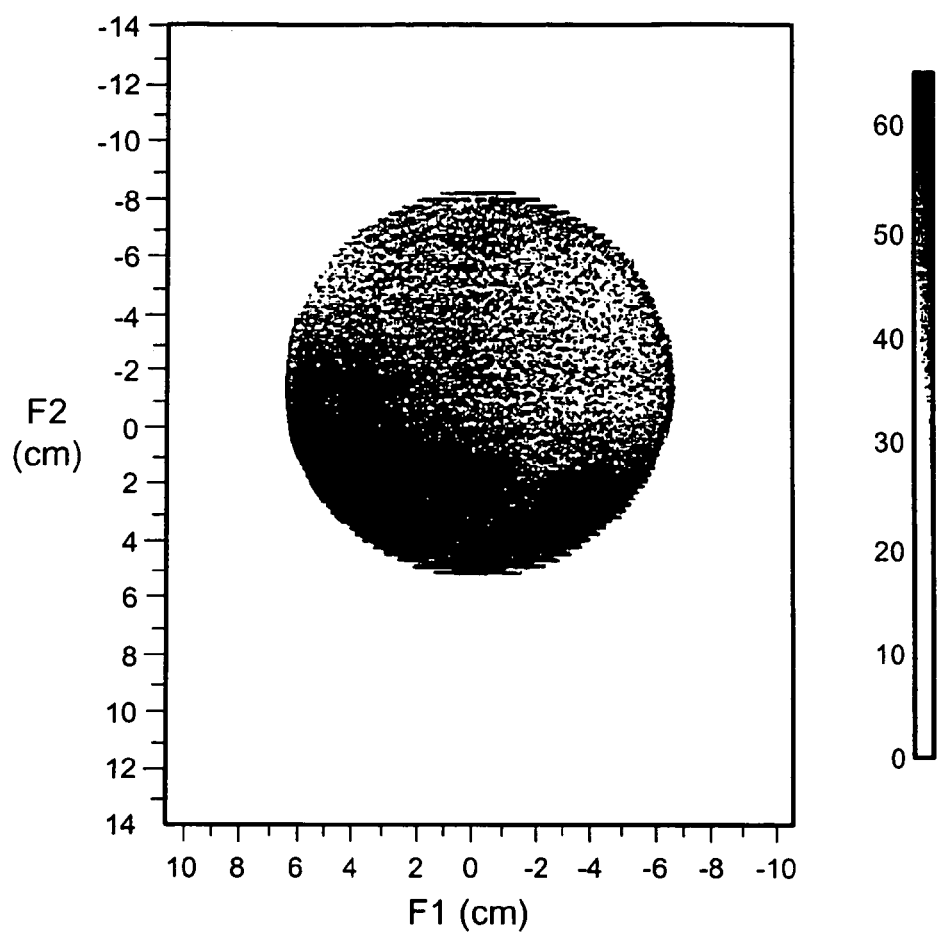
FIG. 9 is a $^1$H flash image of a uniform, low-dielectric oil phantom acquired using the volume resonator of FIG. 5 at 4 T.
Figure 10:
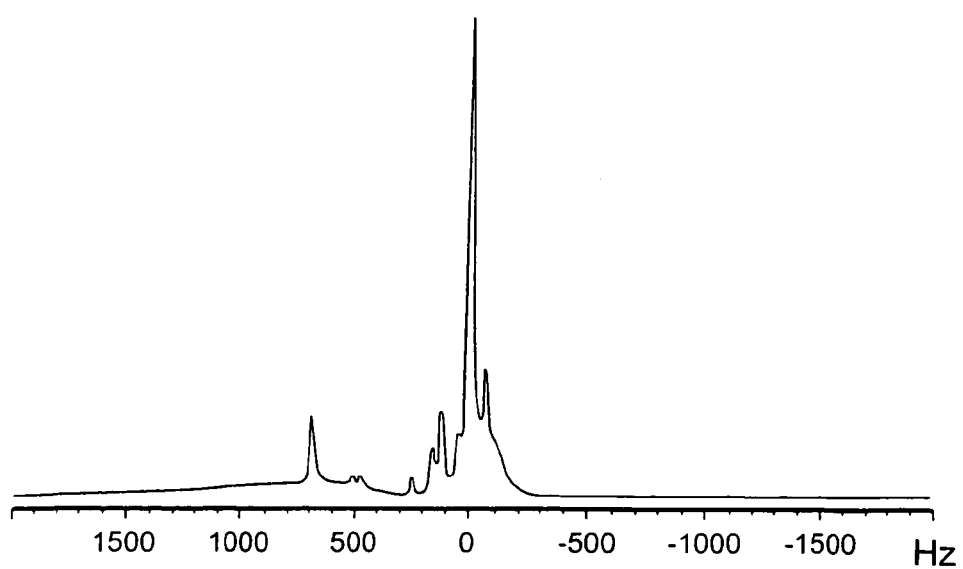
FIG. 10 shows proton spectroscopic data corresponding to the $^1$H flash image of FIG. 9.

To demonstrate the utility of the multiply-tuned volume resonator, a carbon 13/proton ($^{13}C$—$^{1}H$) volume resonator was constructed (see FIG. 5) and tested on a Varian 4 T Unity INOVA whole-body MRI/MRS system (Palo Alto, Calif., USA) interfaced to Siemens Sonata Gradients and amplifiers (Erlangen, Germany). FIG. 9 shows a $^{1}H$ flash image of a uniform, low-dielectric oil phantom acquired at 4 T. This image highlights the excellent homogeneity of the volume resonator at the high gamma frequency of operation. An NMR invisible loader ring shell was used in conjunction with the 15 cm diameter low-dielectric oil cylinder phantom. FIG. 10 shows the corresponding proton spectroscopic data acquired for this phantom using the $^{13}C$—$^{1}H$ volume resonator.

Figure 11:
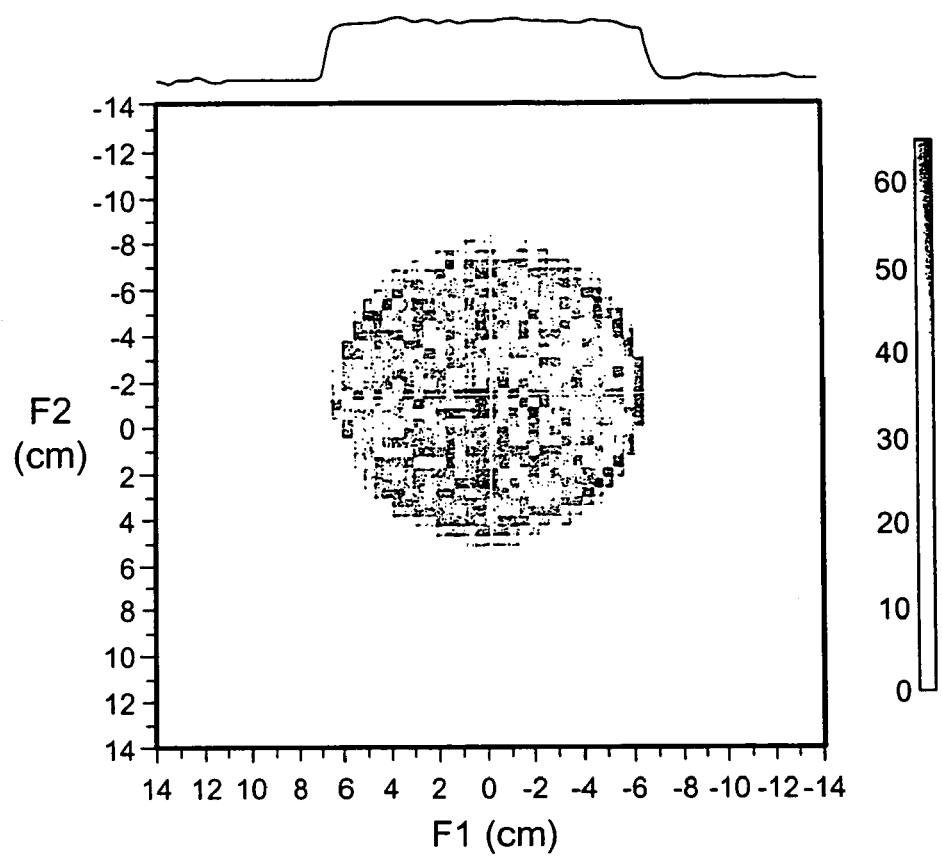
FIG. 11 is a $^{13}$C flash image of a uniform, low-dielectric oil phantom acquired using the volume resonator of FIG. 5.
Figure 12:
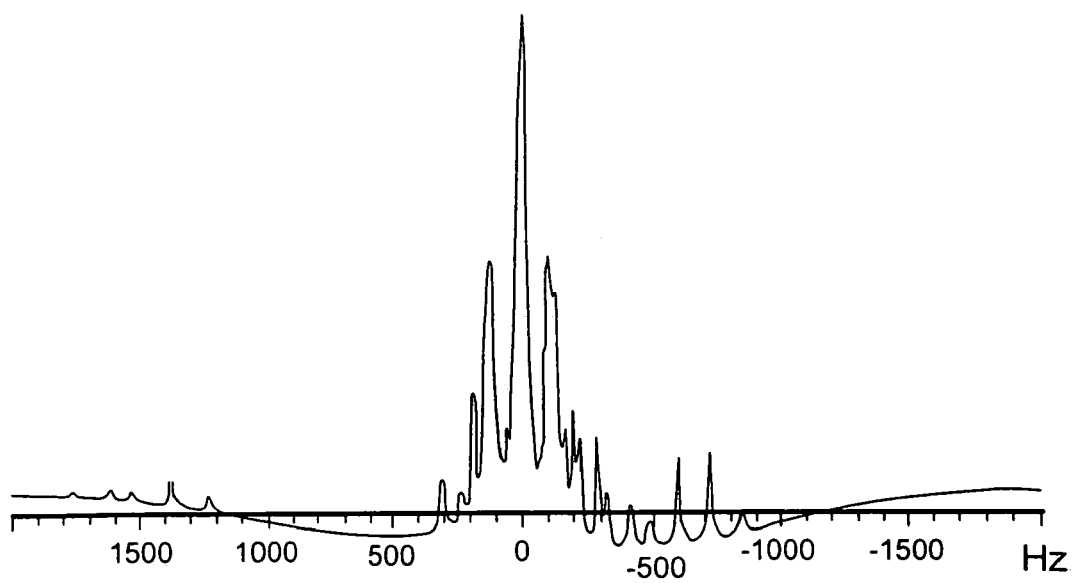
FIG. 12 shows the acquired spectroscopic data corresponding to the $^{13}$C flash image of FIG. 11.
Figure 13:
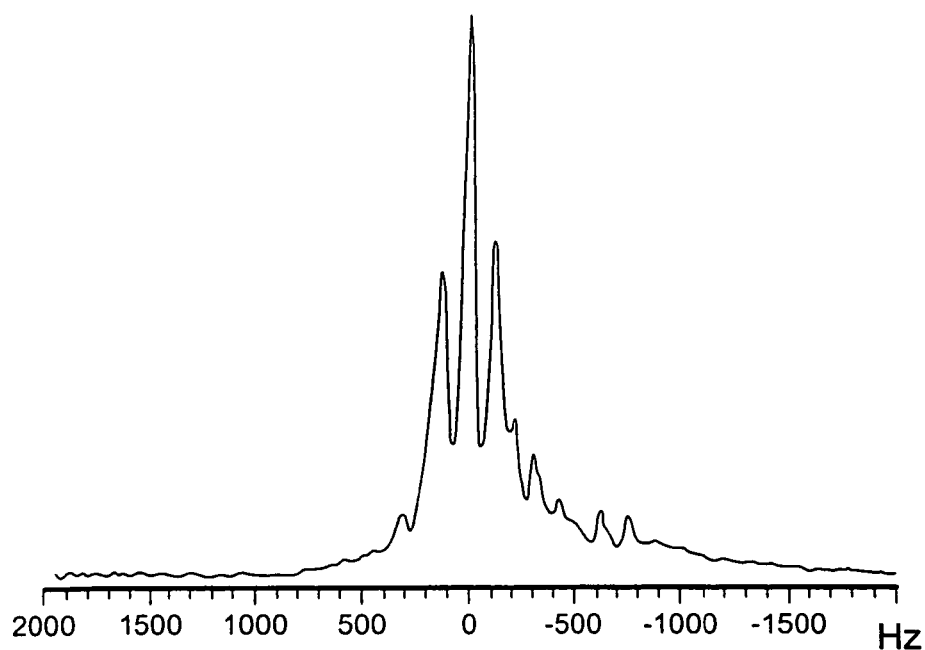
FIG. 13 shows acquired spectroscopic data of a human head using the volume resonator of FIG. 5.

FIG. 11 shows a $^{13}C$ flash image of a uniform, low-dielectric oil phantom acquired using the $^{13}C$—$^{1}H$ volume resonator in a non-$^{1}H$ imaging application. The image confirms the excellent homogeneity and sensitivity at the low-gamma frequency of operation. FIG. 12 shows the corresponding acquired spectroscopic data for this oil phantom using the $^{13}C$-$^{1}H$ volume resonator. FIG. 13 shows the acquired spectroscopic data from the head of a healthy, adult volunteer at 4 T using the same $^{13}C$—$^{1}H$ volume resonator.

Figure 14:
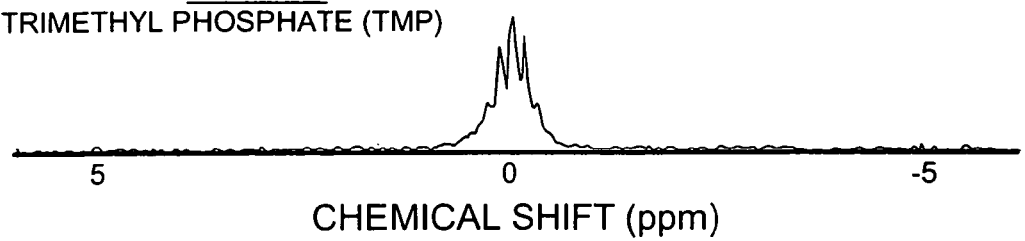
FIG. 14 is proton decoupled phosphorus spectroscopy at 4 T obtained using a $^{31}$P—$^1$H volume resonator.
Figure 14:
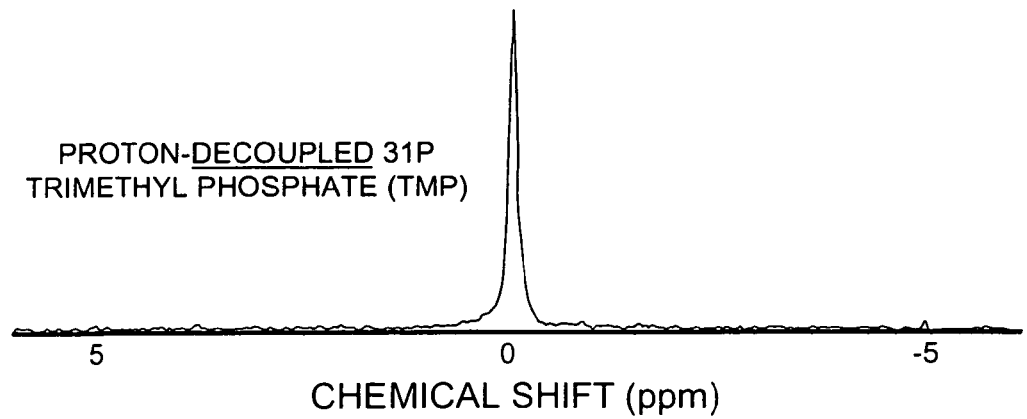

A $^{31}P$-$^{1}H$ volume resonator was also constructed and tested on the Varian 4 T scanner (see FIG. 2). FIG. 14 shows the application of the $^{31}P$—$^{1}H$ volume resonator to proton decoupling experiments.

As will be appreciated, the multiply-tuned hybrid volume resonator is capable of simultaneous or sequential probing of multiple paramagnetic nuclei for use in MR imaging and spectroscopy applications and is capable of identical sampling volumes for each discrete paramagnetic nuclei probed. The volume resonator exhibits low electric field losses making it particularly suited to very high-field MR imaging applications where SAR limitations are of concern. Its unshielded design allows for a non-claustrophobic open coil structure which is ideal for clinical applications without sacrificing homogeneity or SNR. If desired however, the volume resonator may also integrate a shield to reduce gradient coil coupling where necessary.

Although preferred embodiments have been described, those of skill in the art will appreciate that variations and modifications may be made without departing from the spirit and scope thereof as defined by the appended claims.

What is claimed is:

1. A multiply-tuned volume resonator comprising:
   a pair of end rings;
   a plurality of column elements bridging said end rings, said column elements being spaced with a generally even periodicity, said column elements comprising at least two distinct-valued, alternating impedance elements;
   a plurality of reactive elements disposed about said end rings, wherein the reactive elements about said end rings are tuned to the resonant frequency associated with one type of paramagnetic nuclei and wherein the impedance elements are tuned to the resonant frequency associated with at least one other type of paramagnetic nuclei; and
   direct drives for high frequency and low frequency sections of said volume resonator.

2. A volume resonator according to claim 1 wherein said one type are low frequency paramagnetic nuclei and wherein said other type are high frequency paramagnetic nuclei.

3. A volume resonator according to claim 2 wherein the direct drives associated with the low frequency section of said resonator comprise low-pass impedance matching networks associated with said reactive elements to match the low frequency impedance of the volume resonator to the impedance of the low frequency paramagnetic nuclei.

4. A volume resonator according to claim 3 wherein each low-pass impedance matching network is coupled to one of said end rings and straddles a different one of said column elements and is further coupled to a low frequency terminal of said volume resonator.

5. A volume resonator according to claim 4 further comprising baluns interposed between said low-pass impedance matching networks and said low frequency terminals.

6. A volume resonator according to claim 3 wherein the direct drives associated with the high frequency section of said resonator comprise high-pass impedance matching networks associated with said column elements to match the high frequency impedance of the volume resonator to the impedance of the high frequency paramagnetic nuclei.

7. A volume resonator according to claim 6 wherein each high-pass impedance matching network is coupled to a different one of the column elements straddled by said low-pass impedance matching networks, each high-pass impedance matching network straddling a reactive component along said column element and being further coupled to a high frequency terminal of said volume resonator.

8. A volume resonator according to claim 7 further comprising baluns interposed between said high-pass impedance matching networks and said high frequency terminals.

9. A volume resonator according to claim 8 further comprising chokes interposed between said baluns and said high frequency terminals.

10. A volume resonator according to claim 2 wherein said alternating impedance elements include capacitive elements and zero impedance elements.

11. A volume resonator according to claim 10 wherein a plurality of column elements comprising zero impedance elements are positioned between each capacitive column element.

12. A volume resonator according to claim 10 wherein the direct drives associated with the low frequency section of said resonator comprise low-pass impedance matching networks associated with said reactive elements to match the low frequency impedance of the volume resonator to the impedance of the low frequency paramagnetic nuclei and wherein the direct drives associated with the high frequency section of said resonator comprise high-pass impedance matching networks associated with said column elements to match the high frequency impedance of the volume resonator to the impedance of the high frequency paramagnetic nuclei.

13. A volume resonator according to claim 2 wherein said alternating impedance elements include different valued capacitive elements.

14. A volume resonator according to claim 13 wherein the direct drives associated with the low frequency section of said resonator comprise low-pass impedance matching networks associated with said reactive elements to match the low frequency impedance of the volume resonator to the impedance of the low frequency paramagnetic nuclei and wherein the direct drives associated with the high frequency section of said resonator comprise high-pass impedance matching networks associated with said column elements to match the high frequency impedance of the volume resonator to the impedance of the high frequency paramagnetic nuclei.

15. A volume resonator according to claim 2 wherein said alternating impedance elements include capacitive elements and inductive elements.

16. A volume resonator according to claim 15 wherein the direct drives associated with the low frequency section of said resonator comprise low-pass impedance matching networks associated with said reactive elements to match the low frequency impedance of the volume resonator to the impedance of the low frequency paramagnetic nuclei and wherein the direct drives associated with the high frequency section of said resonator comprise high-pass impedance matching networks associated with said column elements to match the high frequency impedance of the volume resonator to the impedance of the high frequency paramagnetic nuclei.

17. A volume resonator according to claim 2 further comprising at least three distinct-valued, alternating impedance elements.

18. A multiply-tuned volume resonator comprising:
    a generally cylindrical birdcage comprising a pair of end rings and generally parallel column elements bridging said end rings at generally equal circumferentially spaced locations, said column elements carrying at least two distinct-valued, alternating impedance components;
    a plurality of capacitors disposed on said end rings, each capacitor being positioned between a pair of adjacent column elements, wherein the capacitors on said end rings are tuned to the resonant frequency associated with a low frequency paramagnetic nuclei and wherein the impedance components on the column elements are tuned to the resonant frequency associated with at least one high frequency paramagnetic nuclei; and
    direct drives for high frequency and low frequency sections of said volume resonator.

19. A volume resonator according to claim 18 wherein the direct drives associated with the low frequency section of said resonator comprise low-pass impedance matching networks associated with said capacitors to match the low frequency impedance of the volume resonator to the impedance of the low frequency paramagnetic nuclei and wherein the direct drives associated with the high frequency section of said resonator comprise high-pass impedance matching networks associated with said column elements to match the high frequency impedance of the volume resonator to the impedance of the high frequency paramagnetic nuclei.

20. A volume resonator according to claim 19 wherein said column elements carry one of alternating capacitive and zero impedance elements, alternating different-valued capacitive elements and alternating capacitive and inductive elements.

* * * * *